US006803849B2

(12) United States Patent
Lowther

(10) Patent No.: US 6,803,849 B2
(45) Date of Patent: Oct. 12, 2004

(54) SOLID STATE INDUCTING DEVICE

(75) Inventor: Rex Lowther, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 10/284,624

(22) Filed: Oct. 31, 2002

(65) Prior Publication Data

US 2004/0085175 A1 May 6, 2004

(51) Int. Cl.[7] .................................................. H01F 5/00
(52) U.S. Cl. ......................... 336/200; 336/223; 336/232; 29/605
(58) Field of Search .............................. 336/200, 223, 336/232; 29/605, 606, 602.1

(56) References Cited

U.S. PATENT DOCUMENTS

| 5,717,243 | A | 2/1998 | Lowther |
| 6,396,362 | B1 | * 5/2002 | Mourant et al. ............. 333/25 |
| 6,476,704 | B2 | * 11/2002 | Goff ............................. 336/200 |
| 6,608,364 | B2 | * 8/2003 | Carpentier ................. 257/531 |
| 2002/0093075 | A1 | 7/2002 | Gates et al. |
| 2002/0130387 | A1 | 9/2002 | Carpentier |

OTHER PUBLICATIONS

2003/0001709 A1, Multiple–interleaved integrated circuit Transformer, Visser, Jan. 2, 2003.*
PCT International Search Report dated Apr. 5, 2004 (6 pages).

* cited by examiner

Primary Examiner—Anh T. Mai
(74) Attorney, Agent, or Firm—Hunton & Williams

(57) ABSTRACT

An integrated circuit having an inducting device with a symmetric inductor. The inducting device comprises a first and second inductor. The first inductor is formed in a first conductive layer and is approximately symmetric about a plane of symmetry. The second inductor is formed in a second conductive layer that is at a select vertical distance from the first conductive layer. The second inductor is further approximately laterally aligned with the first inductor.

36 Claims, 13 Drawing Sheets

SOLID STATE INDUCTING DEVICE

TECHNICAL FIELD

The present invention relates generally to inducting devices incorporated in integrated circuits and in particular the present invention relates to an integrated circuit having an inducting device with a symmetric inductor.

BACKGROUND

Integrated circuits incorporate complex electrical components formed in semiconductor material into a single circuit. Generally, an integrated circuit comprises a substrate upon which a variety of circuit components are formed and connected to form a circuit. Integrated circuits are made of semiconductor material. Semiconductor material is material that provides for the formation of junctions depending on how it is doped, and by the fact that the resistance of the semiconductor material can vary by many orders-of-magnitude, also depending on the concentration of impurities or dopants. Semiconductor material is used to make electrical devices that exploit these properties.

It is desired to design integrated circuits in which electrical components and circuits within the integrated circuit do not interfere with each other. One method of accomplishing this is through the use of differential circuits. A differential circuit is a circuit that is really two circuits with opposite voltages and currents. That is, a differential circuit comprises a first circuit that produces desired voltages and currents and a second circuit that is identical to the first circuit that produces opposite voltages and currents. The opposite voltages and currents work to cancel out parasitics that naturally occur and helps to isolate the circuit from other circuits in the integrated circuit. Further discussion on parasitics can be found in commonly owned U.S. Pat. No. 5,717,243 and U.S. application Ser. No. 10/039,200 which are both incorporated herein by reference. An example of a useful device in a differential circuit is a symmetric inducting device. Symmetric inducting devices can be useful as part of a balun or transformer. Examples of symmetric inducting devices are illustrated in the U.S. application Ser. No. 10/039,200. It is desired in the art to have a symmetric inducting device that has less device area and has less resistive loss without introducing other parasitics.

For the reasons stated above and for other reasons stated below which will become apparent to those skilled in the art upon reading and understanding the present specification, there is a need in the art for an integrated circuit with a symmetric inducting device that has reduced resistive loss with low parasitic characteristics and reduced device area.

SUMMARY

The above-mentioned problems and limitations of existing inductors in integrated circuits and other problems in inducting devices such as transformers or baluns that are composed of more than one inductor are addressed by embodiments of the present invention and will be understood by reading and studying the following specification.

In one embodiment, an inducting device comprises a first and second inductor. The first inductor is formed in a first conductive layer and is approximately symmetric about a plane of symmetry. The second inductor is formed in a second conductive layer that is at a select vertical distance from the first conductive layer. The second inductor is further approximately laterally aligned laterally with the first inductor.

In another embodiment, another inducting device for an integrated circuit is disclosed. The inducting device of this embodiment includes a first inductor and one or more secondary inductors. The first inductor is formed in a first conductive layer and is symmetric about a plane of symmetry. Each secondary inductor is formed in an associated secondary conductive layer a select vertical distance from the first conductive layer. Moreover, each secondary inductor is further generally laterally aligned with the first inductor and is positioned at a different vertical distance from the first inductor than any other of the one or more secondary inductors.

In another embodiment, still another inducting device for an integrated circuit is disclosed. The inducting device comprises a substrate, a first inductor, a second inductor and a layer of shield sections. The substrate has a working surface and a second surface opposite the working surface. The first inductor is formed from a conductive layer overlaying the working surface of the substrate. The first inductor has turns that are approximately symmetric about a plane of symmetry. A second inductor is formed in a conductive layer that is a select distance from the first inductor. Moreover, the first inductor is positioned between the second inductor and the working surface of the substrate. The layer of shield sections are positioned between the second surface of the substrate and the first inductor. The shield sections are more conductive than material they are directly adjacent.

In another embodiment, a method of forming an inductive device in a device region of an integrated circuit is disclosed. The method comprises patterning a first conductive layer into one or more inductor turns that are generally symmetric about a plane of symmetry to form a first inductor and patterning a second conductive layer into one or more inductor turns to form a second inductor that is laterally aligned with and a select vertical distance from the first inductor.

In yet another embodiment, another method of forming an inductive device in an integrated circuit is disclosed. The method comprises forming a first conductive layer overlaying a working surface of a substrate. Patterning the first conductive layer to form one or more inductor turns of a first inductor, wherein the one or more inductive turns of the first inductor are formed approximately symmetric about a plane of symmetry of a first inductor. Forming a dielectric layer overlaying the one or more inductor turns. Forming a second conductive layer overlaying the dielectric layer and patterning the second conductive layer to form one or more turns of a second inductor.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

Figure 1A:
FIG. 1A is a cross-sectional side view of conductive layers formed in integrated circuit of one embodiment the prior art.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "lateral" as used in this application is defined as a direction that runs parallel to the conventional plane or working surface of a wafer or substrate, regardless of the orientation of the wafer or substrate. The term "vertical" refers to a direction perpendicular to the lateral direction. Terms, such as "on", "side", "higher", "lower", "over," "top" and "under" are defined with respect to the conventional plane or working surface being on the top surface of the wafer or substrate, regardless of the orientation of the wafer or substrate. In addition, laterally aligned shall mean that two elements have approximately the same average horizontal position but different vertical positions because they are formed in different layers.

Embodiments of the present invention relate to integrated circuits that include inducting devices, such as transistors, baluns, and other magnetically coupled devices having at least two inductors formed in different conductive layers, wherein the inducting devices include at least one symmetric inductor that has reduced resistance and parasitics. For example, the inducting device embodiments of the present invention can be used to form a balun to convert differential voltages or currents into single ended voltages or currents or vice versa on a chip. In particular, in one embodiment, a first generally symmetric inductor is formed in a first conductive layer and a second inductor is formed in a second conductive layer wherein the first and second inductors are laterally aligned with each other. The conductive layers may be metal layers or other types of conductive layers that have a relatively high conductivity level. In further another embodiment, at least one symmetric inductor is formed in a conductive layer closest to a substrate to obtain a higher inductance to resistance ratio and to reduce substrate losses in the symmetric inductor portion of the device.

Figure 1B:
FIG. 1B is a cross-sectional side view of conductive layers formed in an Integrated circuit of another embodiment of the prior art.

Before a detailed description of the present invention is given, further background is provided to aid in the understanding of the present invention. Referring to FIG. 1A, a device region 100 of an integrated circuit of the prior art is illustrated. The device region 100 comprises a device section 101 formed on a substrate 102. As illustrated, the device section 101 comprises conductive layers 106 and 108. The conductive layers 106 and 108 are separated from each other by layers dielectric material 104. FIG. 1B further shows another embodiment of a device region 120 of the prior art. In this prior art embodiment, device region 120 includes a device section 101 that has three conductive layers 106, 108 and 110 that are separated from each other by layers of dielectric material 104. As with the example of FIG. 1A, the device section 101 of FIG. 1B is formed on the substrate 102. As illustrated in FIGS. 1A and 1B the number of conductive layers that can be formed in a device region can vary. Embodiments of the present invention use two or more conductive layers which are laterally aligned to form two or more inductors wherein one of the inductors is symmetric about a plane of symmetry. In forming inductors, the conductive layers are typically layers of metal but other types of conductive layers could be used in forming inductors and the present invention is not limited to metal layers.

Figure 2:
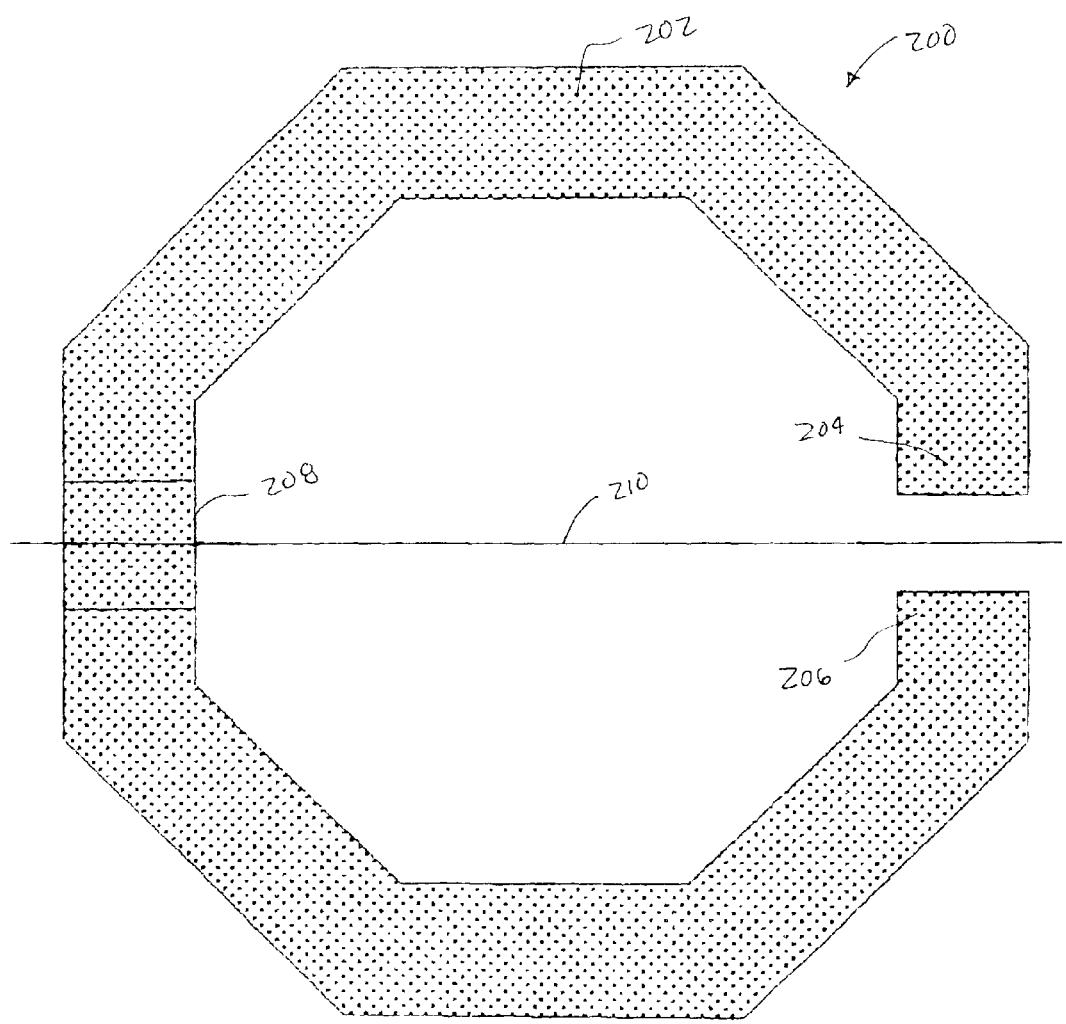
FIG. 2 is a plan view of a symmetric inductor portion of one embodiment of the present invention.
Figure 3:
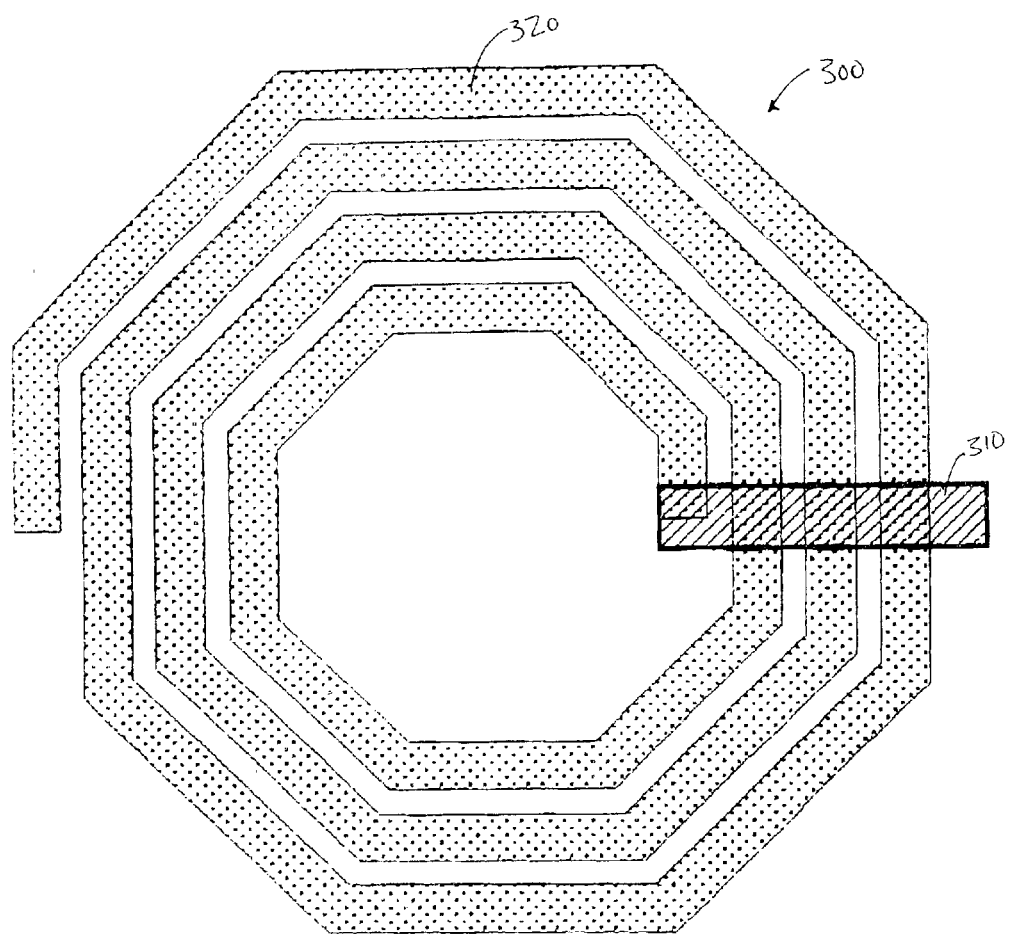
FIG. 3 is a plan view of one embodiment of a non-symmetric inductor portion of the present invention.

Referring to FIG. 2, a plan view of one embodiment of a symmetric inductor 200 of the present invention is illustrated. Symmetric inductor 200 comprises one turn 202 (or ring 202) that is symmetric about the plane of symmetry 210. Inductor 200 includes center tap lead 208 that is positioned at the plane of symmetry and main leads 204 and 206. In one embodiment, symmetric inductor 200 is formed in conductive layer 106 of the device section 101 of FIG. 1A and another symmetric inductor 200 is formed in conductive layer 108. In other embodiments, the symmetric inductor 200 is formed in one of the conductive layers 106 or 108 and a non-symmetric conductor is formed in the other of the conductive layers 106 or 108. An example of one embodiment of a non-symmetric inductor 300 is illustrated in FIG. 3. As FIG. 3 illustrates, this non-symmetric inductor 300 has three and a half turns 320 and lead 310. However, it will be understood in the art that the non-symmetric inductor 300 could have any other number of turns and that the invention is not limited to just three and a half turns.

Figure 4:
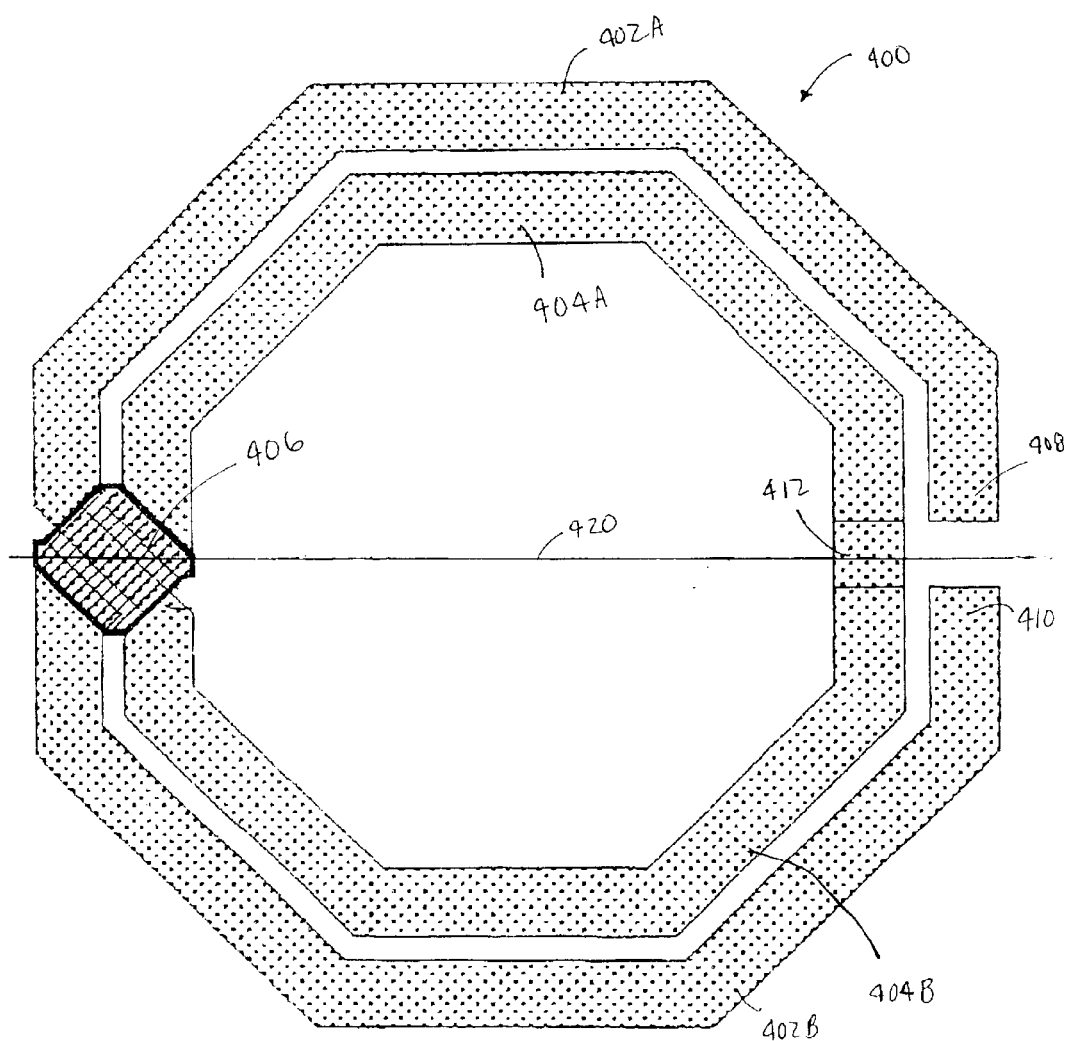
FIG. 4 is a plan view of a another embodiment of a symmetric inductor portion with two turns of the present invention.
Figure 5:
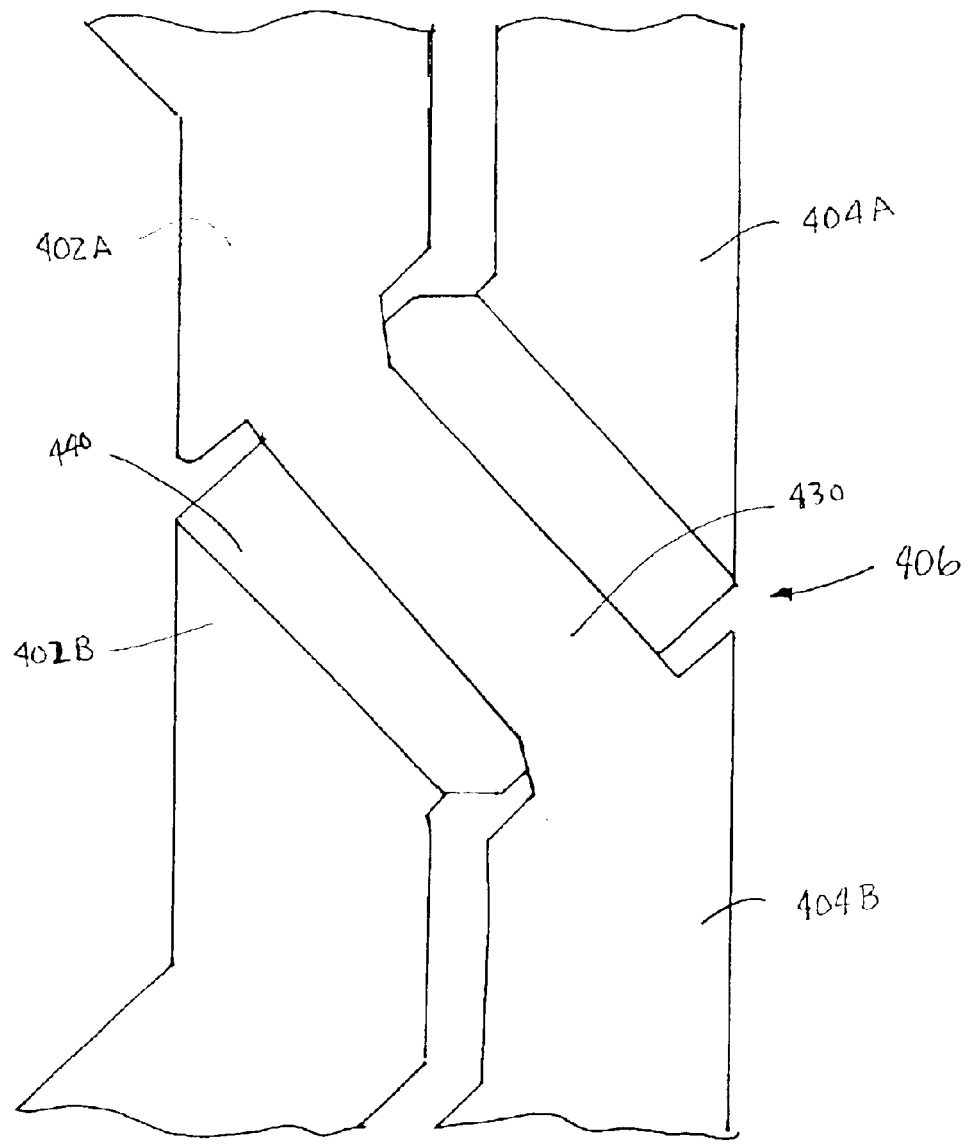
FIG. 5 is a plan view of one embodiment of the turn switching router of the present invention.

Another embodiment of a symmetric inductor 400 of the present invention is illustrated in FIG. 4. As illustrated, this symmetric inductor 400 has two turns which comprise half turns 402A and 402B and 404A and 404B which are generally symmetric about the plane of symmetry 420. Symmetric inductor 400 also includes main leads 408 and 410 and center tap 412 that is positioned at the plane of symmetry 420. To achieve near symmetry about the plane of symmetry 420, symmetric inductor 400 uses turn switching router 406. Referring to FIG. 5, a plan view further illustrates turn switching router 406. As illustrated in FIG. 5, turn switching router 406 includes a first path 430 which provides an electrical path between half turn 402A and half 404B and a second path 440 which provides an electrical path between half turn 404A and half turn 402B. In this embodiment, the first path 430 is formed in the same conductive layer as the half turns 402A, 402B, 404A and 404B and the second path is formed in a different conductive layer. Although, inductor 400 is described as being symmetric, it should be understood that some routers, similar to router 406, may include portions that are asymmetric. Therefore, an associated inductor could be more accurately described as generally or approximately symmetric about a plane of symmetry. In one embodiment of the present invention that incorporates symmetric inductor 400, the device region 120 of FIG. 1B would be used. In this embodiment, two of the adjacent conductive layers 106, 108 and 110 are used to form symmetric inductor 400 and the turn switching router 406 and the remaining conductive layer 106, 108 or 110 is used to form another symmetric or non-symmetric inductor like those illustrated in FIG. 2 and FIG. 3.

Figure 6A:
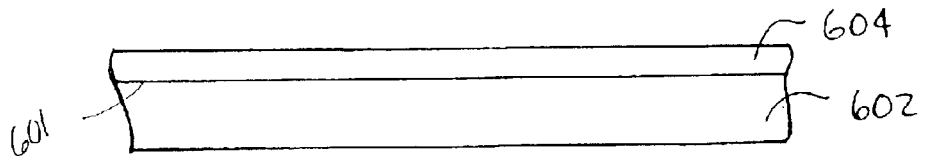
FIGS. 6A through 6G are cross-sectional side views illustrating one method of forming an embodiment of the present invention.
Figure 6B:
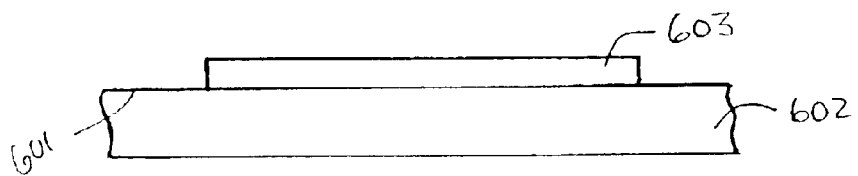
Figure 6C:
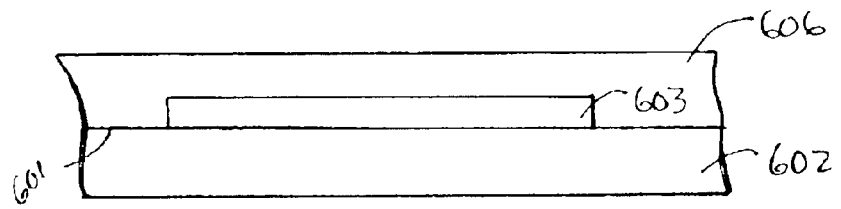
Figure 6D:
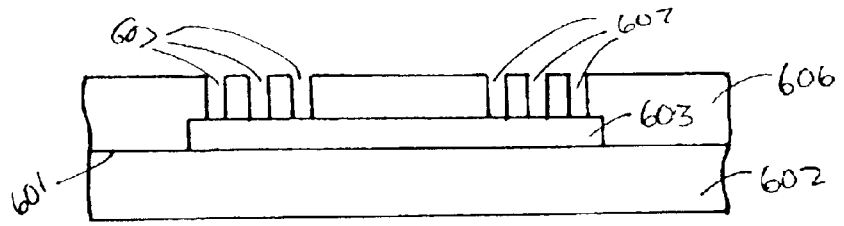
Figure 6E:
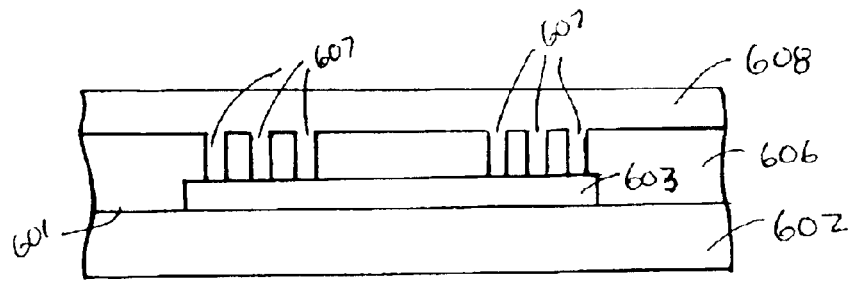
Figure 6F:
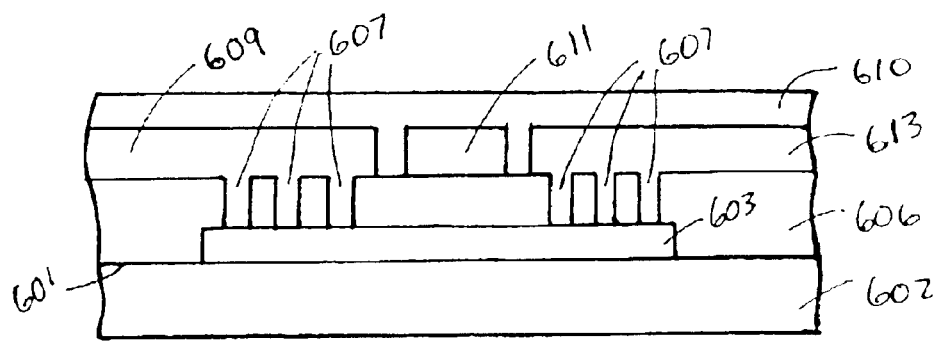

One method of forming an inductive device having a turn switching router is illustrated in the cross sectional side views of FIGS. 6A through 6G. Referring to FIG. 6A, a first conductive layer 604 is deposited on a working surface 601 of substrate 602. The first conductive layer 604 is then patterned as illustrated in FIG. 6B to form a first path 603. A first dielectric layer is then formed overlaying the first path 603 and exposed surfaces areas of the working surface 601 of the substrate 602 as illustrated in FIG. 6C. Referring to FIG. 6D the first dielectric layer 606 is then patterned to form contact openings 607. The contact openings 607 expose select areas of the first path 603. The contact openings 607 are then filled with conductive material. A second conductive layer 608 is then deposited overlying the first dielectric layer 606 as illustrated in FIG. 6E. Referring to FIG. 6F, the second conductive layer 608 is then patterned to form a first symmetric inductor having turns 609 and 613 and second path 611. Turns 609 and 613 and the first and second paths 603 and 611 form a first inductor similar to the symmetric inductor 400 of FIG. 4. A second layer of dielectric material 610 is then formed overlaying turns 609 and 613 as well as the second path 611.

Figure 6G:
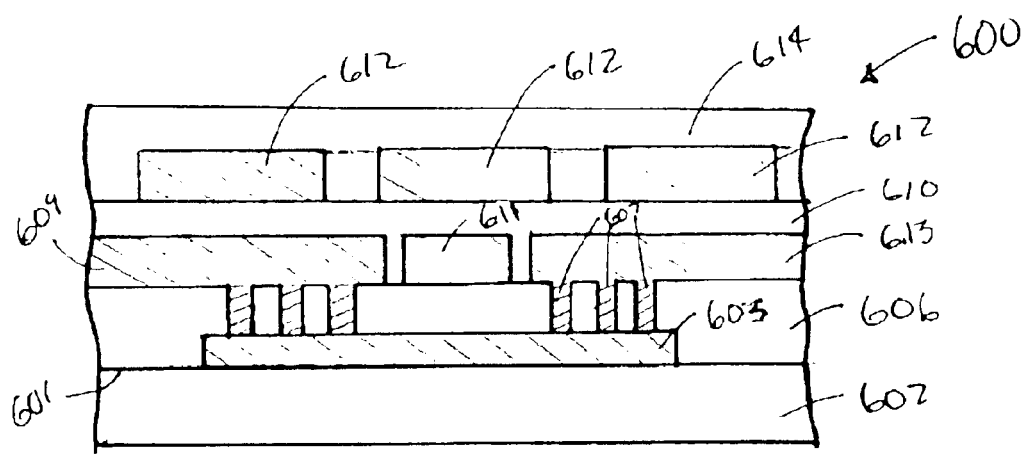

Referring to FIG. 6G, a third conductive layer is deposited overlaying the second layer of dielectric 110 and pattered to form turns 612 of a second inductor. A protective covering layer of dielectric 614 is then formed overlaying turns 612. As illustrated in FIG. 6G, turns 612 of the second inductor are generally laterally aligned with turns 609 and 613 of the first inductor. That is, the first inductor (indicated by turns 609 and 613) are generally laterally positioned between the second inductors (indicated by turns 612) and substrate 602. Although, in this embodiment, the second inductor was non-symmetric, in other embodiments the second inductor is generally symmetric. Moreover, further in other embodiments, the second inductor formed, that overlays a first inductor, is symmetric with two or more turns using a different conductive layer to form a turn switching router.

Figure 7:
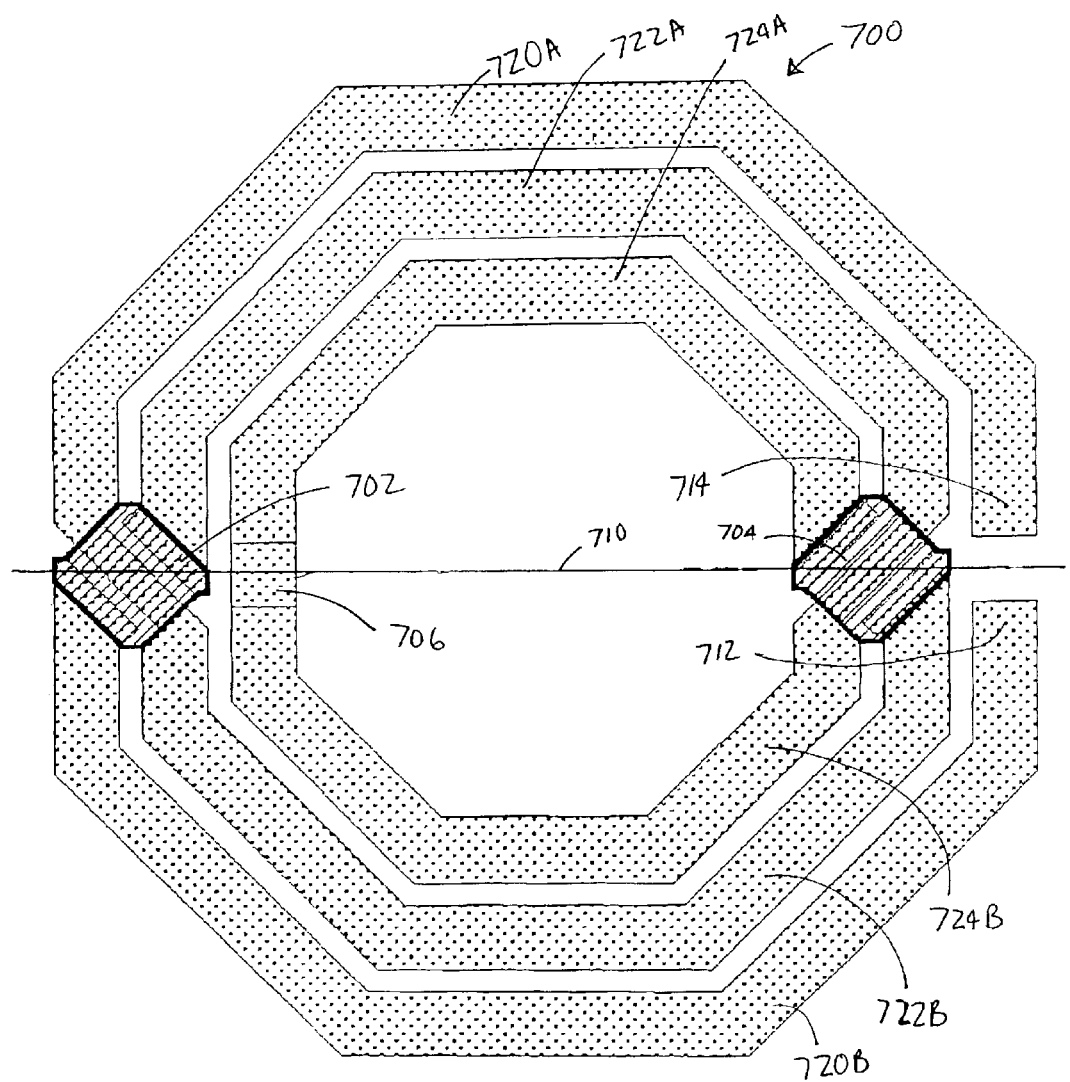
FIG. 7 is a plan view of another embodiment of a symmetric inductor with three turns of the present invention.

An example of a symmetric inductor 700 of the present invention having three turns is illustrated in FIG. 7. As illustrated, symmetric inductor 700 uses two turn switching routers 702 and 704 which are positioned on the plane of symmetry 710 to create symmetric inductor 700. In particular, turn switching router 702 electrically connects half turn 720A to half turn 722B and half turn 722A to half turn 720B. Moreover, turn switching router 704 electrically connects turn 722A with half turn 724B and half turn 724A with half turn 722B. Also illustrated in FIG. 7 is a center tap lead 706 and main leads 714 and 712.

Figure 8:
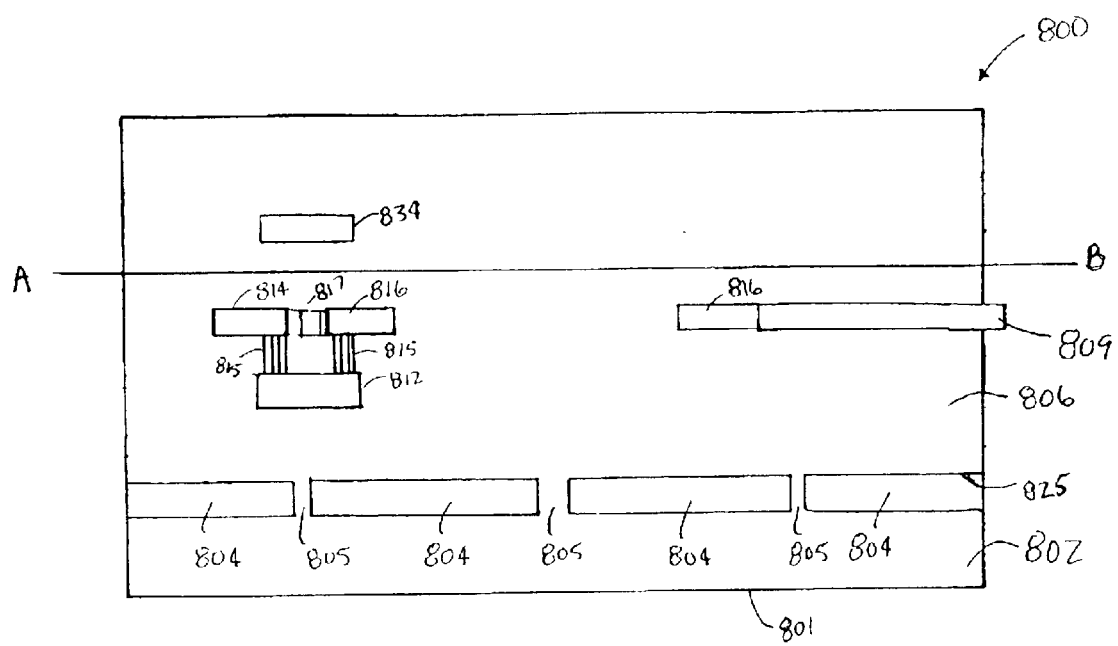
FIG. 8 is a cross-sectional side view of another embodiment of the present invention that includes shield sections.

Referring to FIG. 8, a cross-sectional view of one embodiment of an inducting device 800 of the present invention that includes symmetric inductors and shield sections is illustrated. A first symmetric inductor of this embodiment includes two turns, similar to the embodiment illustrated in FIG. 4. In particular, as illustrated in FIG. 8, the first symmetric inductor portion of this embodiment includes turn portions 814, and 816, first path 817, second path 812 and electrical connections 815. Electrical connections 815 connect the respective turn portions to second path 812 as illustrated. Inductor device 800 also includes a second symmetric inductor that is formed a select vertical distance from the symmetric inductor by dielectric layer 806. The second symmetric inductor has one turn and is similar to the inductor of FIG. 2. In particular, the second symmetric inductor includes turn portion 834. In other embodiments, symmetric inductors with more than one turn and non-symmetric inductors are used in place of the second inductor.

The embodiment of FIG. 8 also includes shields sections 804 that are positioned between a second surface 801 of the substrate 802 and the first inductor. The second surface 801 of the substrate is opposite the working surface 825 of the substrate 802. The shield sections 804 help cancel out voltages and are formed in a conductive layer that is vertically positioned below the inductors. In particular, the shield sections 804 reduce resistance and parasitics to provide a high Q factor. In addition, the shield sections 804 help provide isolation from the rest of the circuits in the integrated circuit. The shield sections are patterned from a layer of material that is more conductive than any of the material it is directly adjacent. The shield sections 804 are separated from each other by gaps 805 to reduce eddy currents. Also illustrated in the embodiment of FIG. 8 is center tap 809 which is positioned along a plane of symmetry and in this embodiment electrically coupled to turn portion 822.

Figure 9:
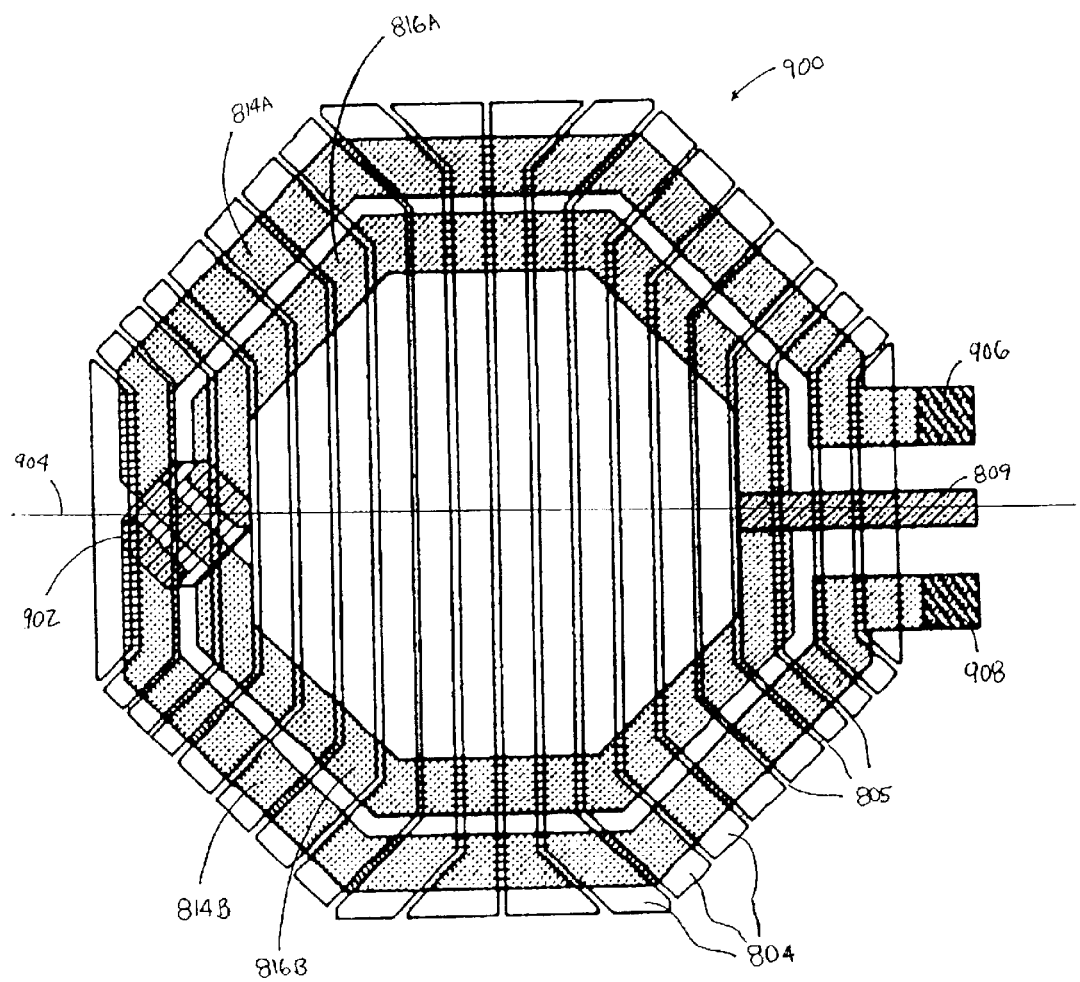
FIG. 9 is a plan view of FIG. 8 at line A_B which illustrates one embodiment of a two turn symmetric inductor and the shield sections of the embodiment of FIG. 8.

A plan view along line A_B of FIG. 8 is illustrated in FIG. 9. FIG. 9 provides further illustration of a portion of the inducting device 900 that includes the first symmetric inductor and shield sections. As illustrated, the first symmetric inductor includes half turns 814A, 816A, 814B and 816B and a turn switching router 902. The symmetric device is further illustrated as having main leads 906 and 908. In this embodiment, the shield sections 804 are patterned with the gaps 805 in such a manner that the shield sections 804 are also symmetric to the plane of symmetry 904. This design allows for a very low resistance path to AC ground (the plane of symmetry 904).

Figure 10:
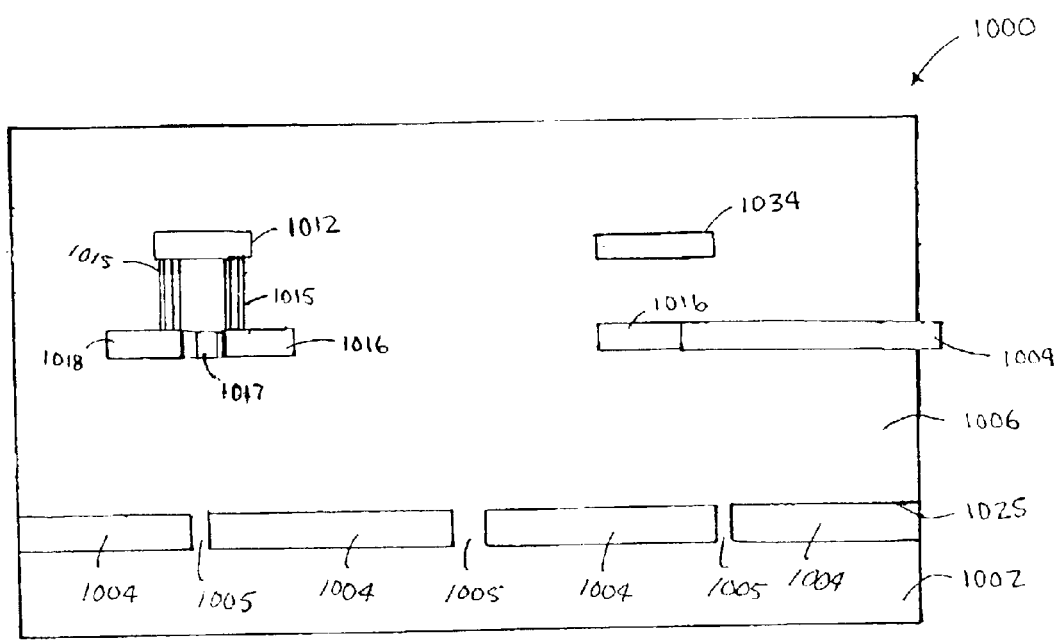
FIG. 10 is a cross-sectional side view of another embodiment of the present invention.

Referring to FIG. 10, a cross-sectional side view of another embodiment of an inducting device 1000 of the present invention is illustrated. In this embodiment, a first inductor comprising turn portions 1018 and 1016 use a second current path 1012 (or second path 1012) of a turn switching router to achieve relative symmetry to a plane of symmetry. The second path 1012 is formed in the same conductive layer as a second inductor which is indicated by turn 1034. However, in this embodiment, the second inductor does not occupy the same area of the conductive layer that the second path 1012 occupies. This is accomplished, in this embodiment, by implementing the second inductor with only one turn 1034 (similar to the inductor illustrated in FIG. 2) and providing a gap large enough between the leads of the second inductor (leads are illustrated in FIG. 2) to accommodate the area occupied by the second path 1012.

The turn switching router of FIG. 10 further includes first current path 1017 (or first path 1017) and electrical connections 1015. The first inductor of this embodiment is similar to the symmetric inductor of FIG. 4. In the embodiment of FIG. 10, however, the second current path 1012 of the switching router is formed in a conductive layer that is farther away from the working surface 1025 of the substrate 1002 than the first path 1017 of the turn switching router. This embodiment of inducting device 1000 is also illustrated as having shield sections 1004 separated by gaps 1005. Also illustrated is center tap 1009 which is positioned along the plane of symmetry and is electrically coupled to turn portion 1016. Moreover the conductive layers that are formed into the first and second inductors are separated by dielectric material referenced generally as 1006.

Figure 11:
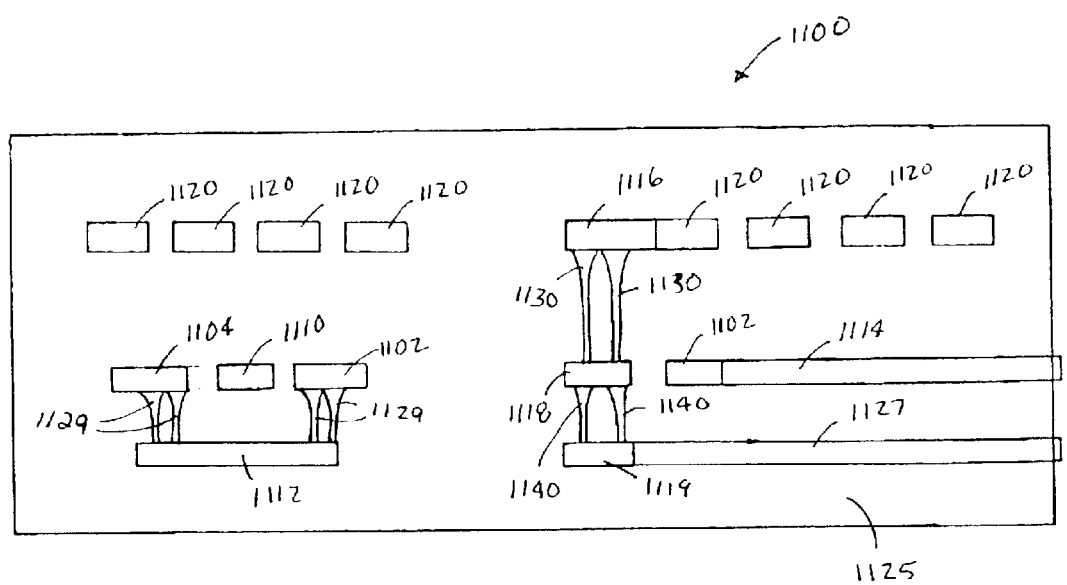
FIG. 11 is a cross-sectional side view of yet another embodiment of the present invention.

Further another embodiment of an inducting device of the present application is illustrated in FIG. 11. In particular, FIG. 11 illustrates the cross-sectional side view of an embodiment of an inducting device 1100 formed in a device section of a device region. This embodiment includes a first inductor that is illustrated as having turn portions 1104 and 1102 and a second inductor having turns 1120. FIG. 11 illustrates an embodiment where an inducting device (the second inductor in this embodiment) can be implemented using a conductive layer that is farther than one conductive layer away from the conductive layer the turns (turns 1120) of the inductor are formed in. Turns 1120 of the second inductor are similar to turns 320 of the non-symmetric inductor of FIG. 3. However, the second inductor illustrated in FIG. 11 includes first, second and third bypass sections 1116, 1118 and 1119 respectfully. The bypass sections 1116, 1118 and 1119 provide a conduction path out of the inductor via terminal 1127. In particular, as illustrated, bypass section 1116 is electrically coupled to a section of turn 1120 to provide a conduction path from the second inductor. Bypass section 1116 is coupled to bypass section 1118 via electrical connections 1130. Bypass section 1118 is in turn electrically coupled to bypass 1119 via electrical connections 1140. Bypass section 1119 is further electrically coupled to terminal 1127 to complete the conductive path from the second inductor to out of the inducting device. In another embodiment, (not shown) terminal 1127 exits the device in a direction that is perpendicular to the cross-sectional side view of FIG. 11. In further another embodiment, (not shown) terminal 1127 exists the device in direction to the left of the cross-sectional side view of FIG. 11. In this embodiment, terminal 1127 and an associated bypass section are formed down another conductive layer to clear the second path 1112 of the turn switch router.

The embodiment of FIG. 11, further includes an approximately symmetric first inductor which is indicated by turn portions 1104 and 1102. The first inductor also includes a turn switch router which is indicated by first path 1110 and second path 1112. The second path 1120 is electrical coupled to turns 1104 and 1102 by electrical connections 1129. As illustrated, the first path 1110 is formed in the same conductive layer as turn portions 1104 and 1102 and the second path 1112 is formed in the same conductive layer as bypass 1119 of the second inductor. Moreover, the second bypass 1118 is also formed in the same conductive layer as turn portions 1104 and 1102. Also illustrated in FIG. 11 is center tap 1114 which is electrically coupled to turn portion 1102 and is also formed in the same conductive layer as turn portions 1104 and 1102. Moreover the conductive layers that are formed into the first and second inductors are separated by dielectric material referenced generally as 1125.

Figure 12:
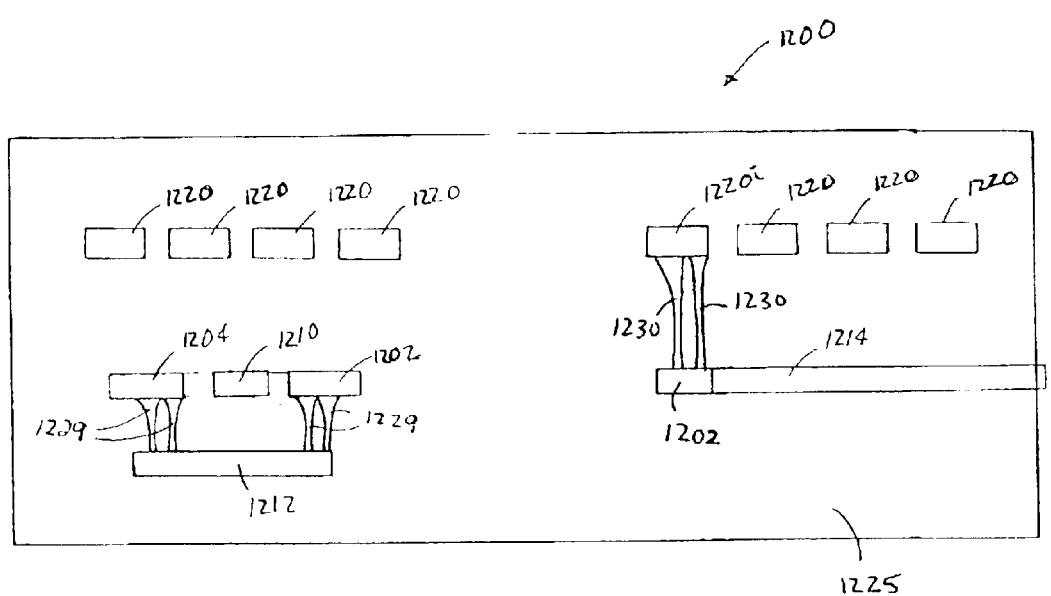
FIG. 12 is a cross-sectional view of still another embodiment of the present invention.

Yet still another embodiment of the present invention is illustrated in FIG. 12. In particular, FIG. 12 illustrates the cross-sectional side view of an embodiment of an inducting device 1200 formed in a device section of a device region. This embodiment includes a first inductor that is illustrated as having turn portions 1204 and 1202 and a second inductor having turns 1220. The first inductor of this embodiment is similar to the inductor illustrated in FIG. 4 of the present invention. As FIG. 12 illustrates, the first inductor also includes a turn switching router. The turn switching router is indicated by first path 1210 and second path 1212. Also illustrated in FIG. 12 are electrical connections 1229 which electrically connect the second path 1212 to turns 1204 and 1202. In addition, this embodiment also includes center tap 1214 which is electrically connected to a section of turn 1202. Turns 1220 of the second inductor are similar to turns 320 of the non-symmetric inductor of FIG. 3. In this embodiment, however, a section of an interior turn 1220$i$ of the second inductor is electrically coupled to the center tap 1214 via electrical connections 1230 and the section of turn 1202 of the first inductor as is illustrated in FIG. 12. Moreover the conductive layers that are formed into the first and second inductors are separated by dielectric material referenced generally as 1225.

An important aspect of the embodiment of FIG. 12 is that the interior turn 1202$i$ of the second inductor is electrically connected directly to an interior turn 1202 of the first inductor. In other embodiments similar to the embodiment of FIG. 12, one or more lateral extensions of select lateral lengths (similar to the bypasses 1116 and 1119 of the embodiment illustrated FIG. 11) are formed in the first and second layers to achieve relatively vertical connections through electrical connections 1230 (or vias 1230). That is, such vertical extensions may be used when the interior turns of the first and second inductors are not already laterally aligned to provide generally vertical electrical connections similar to the vertical connections 1230 illustrated in the embodiment of FIG. 12.

Although specific embodiments have been illustrated and described herein, it will be appreciated by those of ordinary skill in the art that any arrangement, which is calculated to achieve the same purpose, may be substituted for the specific embodiment shown. For example, more than two metal layers could be used to form inducting devices having more than two symmetric turns by using several different metal layers to form the required turn switching routers. This application is intended to cover any adaptations or variations of the present invention. Therefore, it is manifestly intended that this invention be limited only by the claims and the equivalents thereof.

What is claimed is:

1. An inducting device comprising:
    a first inductor formed in a first conductive layer, wherein the first inductor is approximately symmetric about a plane of symmetry;
    a second inductor formed in a second conductive layer, wherein the second inductor is approximately aligned laterally with the first inductor;
    a substrate having a working surface and a second surface opposite the working surface, wherein the first and second inductors are formed overlaying the working surface of the substrate; and
    shield layer sections positioned between the second surface of the substrate and the first and second inductors, wherein the shield sections are more conductive than material they are directly adjacent.

2. The inducting device of claim 1, wherein the second inductor is also formed approximately symmetric about the plane of symmetry.

3. The inducting device of claim 1, wherein at least one of the first and second inductors has one turn.

4. The inducting device of claim 1, wherein at least one of the first or second inductors has two or more turns.

5. The inducting device of claim 1, wherein the first inductor has a center tap positioned at the plane of symmetry.

6. The inducting device of claim 5, wherein the second inductor has a turn portion that is electrically coupled to the center tap of the first inductor.

7. The inducting device of claim 1, wherein the first inductor has two or more turns.

8. The inducting device of claim 7, further comprising:
one or more turn switching routers coupled to allow generally symmetric conductive paths for the two or more turns of the first inductor along the plane of symmetry.

9. The inducting device of claim 8, wherein each turn switching router further comprises:
a first path formed in the first conductive layer to provide a conductive path through the first conductive layer; and
a second path formed in part in a third conductive layer to provide a conductive path around the first path, wherein the third conductive layer is positioned a select vertical distance from the first conductive layer.

10. The inducting device of claim 8, wherein each turn switching router further comprises:
a first path formed in the first conductive layer to provide a conductive path through the first conductive layer; and
a second path formed in part in the second conductive layer to provide a current path around the first path.

11. The inducting device of claim 1, further comprising:
two or more bypass sections adapted to provide a conductive path out of the secondary inductor, wherein each of the two or more bypass sections are formed in different conductive layers.

12. The inducting device of claim 11, wherein one of the two or more bypass sections is formed in the same conductive layer as the secondary inductor and is further electrically coupled to a turn of the secondary inductor.

13. The inducting device of claim 11, wherein one of the two or more bypass sections is formed in the first conductive layer.

14. The inducting device of claim 11, further comprising:
a terminal coupled to one of the two or more bypass sections to provide a conductive path out of the inducting device.

15. An inducting device for an integrated circuit, the inducting device comprising:
a first inductor formed in a first conductive layer, wherein the first inductor is generally symmetric about a plane of symmetry;
one or more secondary inductors, wherein each secondary inductor is formed in an associated secondary conductive layer and is generally laterally aligned with the first inductor and positioned at a different vertical distance from the first inductor than any other of the one or more secondary inductors;
a substrate having a working surface and a second surface opposite the working surface, wherein the first and one or more secondary inductors are formed overlaying the working surface of the substrate; and
shield layer sections positioned between the second surface of the substrate and the first and the one or more secondary inductors, wherein the shield sections are more conductive than material they are directly adjacent.

16. The inducting device of claim 15, wherein at least one of the one or more secondary inductors is also generally symmetric about the plane of symmetry.

17. The inducting device of claim 15, wherein the first inductor has one turn.

18. The inducting device of claim 15, wherein the first inductor has two or more turns.

19. The inductor device of claim 18, further comprising:
one or more turn switching routers electrically connected to route the two or more turns generally symmetrically about the plane of symmetry.

20. The inducting device of claim 19, wherein each turn switching router comprises:
a first conductive path adapted to electrically connect a first half of a first one of the two or more turns to a second half of a second one of the two or more turns; and
a second conductive path formed in a different conductive layer than the first path is formed in, the second conductive path adapted to electrically connect a first half of the second one of the two or more turns to a second half of the first of the two or more turns.

21. The inducting device of claim 15, wherein the shield sections are generally symmetric about the plane of symmetry.

22. An inducting device for an integrated circuit, the inducting device comprising:
a substrate having a working surface and a second surface opposite the working surface;
a first inductor formed from a conductive layer overlaying the working surface of the substrate, the first inductor having one or more turns that are approximately symmetric about a plane of symmetry;
a second inductor formed in a conductive layer that is a select distance from the first inductor, wherein the first inductor is positioned between the second inductor and the working surface of the substrate; and
a layer of shield sections positioned between the second surface of the substrate and the first inductor, the shield sections being more conductive than material they are directly adjacent.

23. The inducting device of claim 22, wherein the second inductor is also approximately symmetric about the plane of symmetry.

24. The inducting device of claim 22, wherein the shield sections are also approximately symmetric about the plane of symmetry.

25. The inducting device of claim 22, wherein the first inductor has two or more turns.

26. The inducting device of claim 25, further comprising:
one or more turn switching routers adapted to approximately symmetrically connect the two more turns along the plane of symmetry.

27. The inducting device of claim 26, wherein each turn switching router comprises:
a first conductive path adapted to electrically connect a first half of a first one of the two or more turns to a second half of a second one of the two or more turns; and a second conductive path formed in a different conductive layer than the first path is formed in, the second conductive path adapted to electrically connect a first half of the second one of the two or more turns to a second half of the first of the two or more turns.

28. A method of forming an inductive device in an integrated circuit, the method comprising:

patterning a first conductive layer into one or more inductor turns that are generally symmetric about a plane of symmetry to form a first inductor;

patterning a second conductive layer into one or more inductor turns to form a second inductor that is laterally aligned with and a select vertical distance from the first inductor; and forming conductive shield sections from a conductive layer positioned between a substrate and the first and second inductors, wherein the conductive shield sections are more conductive than material they are directly adjacent.

29. The method of claim 28, wherein the one or more turns of the second inductor are also generally symmetric about the plane of symmetry.

30. The method of claim 28, wherein the first inductor has two or more turns.

31. The method of claim 30, further comprising:

forming one or more turn switching routers adapted to electrically connect the two or more turns of the first inductor in a generally symmetrical fashion about the plane of symmetry.

32. The method of claim 31, wherein forming each turn switching router further comprises:

patterning a first path in the first conductive layer to electrically connect a first half of a first one of the one or more turns to a second half of a second of the one or more turns;

pattering a third conductive layer that is at a different vertical level than the first conductive layer into a second path;

forming vertical electrical contacts between a first half of the second of the one or more turns and the second path; and forming vertical electrical contacts between a second half of the first of the one or more turns.

33. A method of forming an inductive device in an integrated circuit, the method comprising:

forming a first conductive layer overlaying a working surface of a substrate;

patterning the first conductive layer to form one or more inductor turns of a first inductor, wherein the one or more turns of the first inductor are formed approximately symmetric about a plane of symmetry;

forming a dielectric layer overlaying the one or more inductor turns;

forming a second conductive layer overlaying the dielectric layer; and patterning the second conductive layer to form one or more turns of a second inductor; and forming shield sections from a conductive layer, wherein the shield sections are positioned between a second surface of the substrate that is opposite the working surface of the substrate and the first inductor.

34. The method of claim 33, wherein the first inductor has two or more turns.

35. The method of claim 34, further comprising:

forming one or more turn switching routers adapted to electrically connect the two or more turns of the first inductor in approximately symmetric fashion about the plane of symmetry.

36. The method of claim 35, wherein forming each turn switching router further comprises:

patterning a first path in the first conductive layer to electrically connect a first half of a first one of the one or more turns to a second half of a second of the one or more turns;

patterning a third conductive layer that is at a different vertical level than the first conductive layer into a second path;

forming vertical electrical contacts between a first half of the second of the one or more turns and the second path; and forming vertical electrical contacts between a second half of the first of the one or more turns.

* * * * *